United States Patent [19]
Tonti et al.

[11] Patent Number: 6,114,221
[45] Date of Patent: Sep. 5, 2000

[54] METHOD AND APPARATUS FOR INTERCONNECTING MULTIPLE CIRCUIT CHIPS

[75] Inventors: William R. Tonti; Richard Q. Williams, both of Essex Junction, Vt.

[73] Assignee: International Business Machines Corporation, Armonk, N.Y.

[21] Appl. No.: 09/039,962

[22] Filed: Mar. 16, 1998

[51] Int. Cl.⁷ ................................................. H01L 21/30
[52] U.S. Cl. ..................... 438/455; 438/457; 438/456; 438/458; 438/459; 438/689; 438/107; 438/108; 438/109; 257/686; 257/773; 257/785
[58] Field of Search ................................. 438/455, 456, 438/457, 458, 459, 689, 107, 108, 109; 257/686

[56] References Cited

U.S. PATENT DOCUMENTS

| | | | |
|---|---|---|---|
| 4,975,143 | 12/1990 | Drake et al. ............................ | 156/633 |
| 4,996,587 | 2/1991 | Hinrichsmeyer et al. ................ | 357/74 |
| 5,229,647 | 7/1993 | Gnadinger ............................... | 257/785 |
| 5,356,838 | 10/1994 | Kim ......................................... | 437/226 |
| 5,454,160 | 10/1995 | Nickel ...................................... | 29/840 |
| 5,492,223 | 2/1996 | Boardman et al. ....................... | 206/710 |
| 5,508,563 | 4/1996 | Tazawa et al. ........................... | 257/773 |
| 5,525,065 | 6/1996 | Sobhani .................................... | 439/67 |
| 5,532,519 | 7/1996 | Bertin et al. ............................. | 257/777 |
| 5,556,808 | 9/1996 | Williams et al. ......................... | 437/209 |
| 5,567,653 | 10/1996 | Bertin et al. ............................. | 437/173 |
| 5,589,083 | 12/1996 | Ahn et al. ................................. | 216/24 |
| 5,613,033 | 3/1997 | Swamy et al. ........................... | 361/790 |
| 5,661,901 | 9/1997 | King .......................................... | 29/830 |
| 5,712,190 | 1/1998 | Bertin et al. ............................. | 437/173 |
| 5,834,324 | 11/1998 | Nakamoto ................................. | 438/20 |
| 5,872,025 | 2/1999 | Cronin et al. ............................. | 438/109 |

Primary Examiner—John F. Neibling
Assistant Examiner—Viktor Simkovic
Attorney, Agent, or Firm—John J. Goodwin

[57] ABSTRACT

A method for fabricating an interconnected multiple circuit chip structure by etching a first substrate to form protrusions on its surface. Then the protrusions are preferentially etched to produce a selected shape such as a tetragonal protrusion and an integrated circuit is then fabricated on the substrate. A second substrate is preferentially etched to form recesses having a selected shape that is the complement of the selected shape of the protrusions of the first substrate and then an integrated circuit is fabricated on the second substrate. The protrusions and recesses are coated with an electrically conductive metal such as aluminum. The first and second substrates are joined and aligned together such that the protrusions mate with the recesses and the structure is annealed such that the metal coatings thereon come into contact to electrically connect the integrated circuits on the substrates. The method can also be used to electrically connect multiple chips mounted back to front.

8 Claims, 5 Drawing Sheets

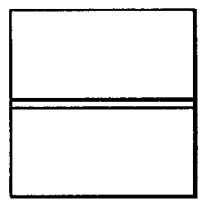
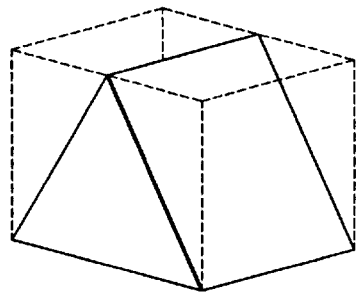
FIG.5      FIG.6
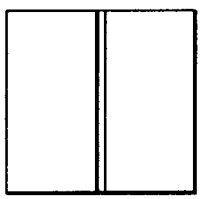
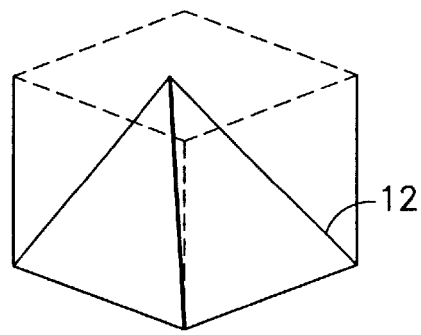
FIG.7      FIG.8
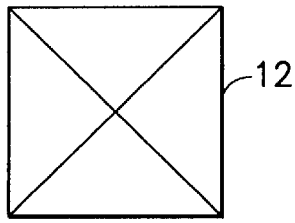
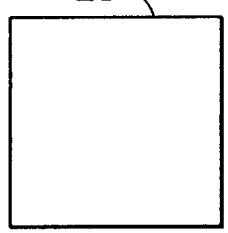
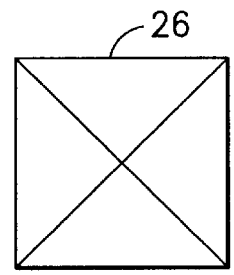
FIG.9    FIG.11    FIG.12
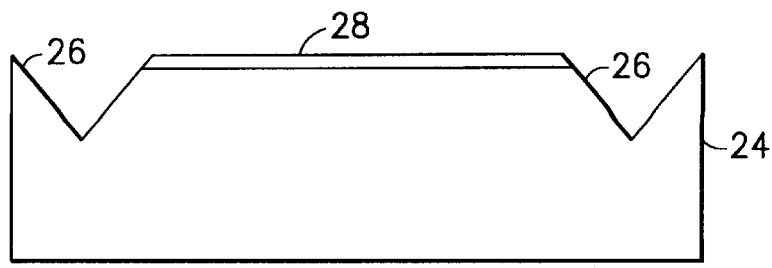
FIG.10

METHOD AND APPARATUS FOR INTERCONNECTING MULTIPLE CIRCUIT CHIPS

BACKGROUND OF THE INVENTION

1. Technical Field

The present invention relates to fabricating integrated circuit structures, and more particularly to a method for electrically interconnecting a plurality of stacked circuit chips.

2. Background Art

Present techniques for improving the performance of semiconductor devices include incorporating multiple integrated circuit chips in the same integrated circuit package to minimize wire path length.

One known technique is to place two or more circuit chips side by side and to electrically connect them using bond wires. This approach introduces lead parasitics that impact performance.

Another known approach is to provide a stacked structure by mounting one circuit chip on top of the other and connecting them using C4 solder ball technology. This approach requires special metallurgy and processing to form the C4 joints.

An example of a technique for arranging stacked circuit chips is described in U.S. Pat. No. 5,532,519 issued Jul. 2, 1996 to Bertin et al. entitled CUBE WIREABILITY ENHANCEMENT WITH CHIP-TO-CHIP ALIGNMENT AND THICKNESS CONTROL. This reference discloses a stacked chip arrangement where protuberances on one chip mate with recesses on another chip for alignment purposes.

Other references relating to stacked circuit chips include:

U.S. Pat. No. 5,661,901 issued Sep. 2, 1997.
U.S. Pat. No. 5,613,033 issued Mar. 18, 1997.
U.S. Pat. No. 5,454,160 issued Oct. 3, 1995.
U.S. Pat. No. 5,356,838 issued Oct. 16, 1994.
U.S. Pat. No. 5,229,647 issued Jul. 20, 1993.
U.S. Pat. No. 5,508,563 issued Apr. 16, 1996.
U.S. Pat. No. 4,996,587 issued Feb. 26, 1991.
U.S. Pat. No. 5,492,223 issued Feb. 20, 1996.

SUMMARY OF THE INVENTION

An object of the present invention is to provide a method for electrically interconnecting a plurality of circuit chips in a stack.

Another object of the present invention is to provide a method for forming tetragonal contacts to electrically interconnect circuit chips.

A further object of the present invention is to provide a selective etching method for forming tetragonal pits and points to make electrical contact between two front to front or back to front circuit chips.

Still another object of the present invention is to provide a stacked circuit chip structure having excellent thermal coefficient of expansion properties.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

BRIEF DESCRIPTION OF THE DRAWINGS

FIGS. 5, 6, 7, 8, and 9 are schematic illustrations of the masking and etching processes used in the contact point fabrication steps of the present invention.

FIG. 10 is a cross sectional illustration of a chip circuit with shaped pit contacts according to the principles of the present invention.

FIGS. 11 and 12 are schematic illustrations of the shape of the etch mask and resultant cavity used in the present invention.

DETAILED DESCRIPTION OF THE INVENTION

The method of fabricating circuit chips for stacked mounting in the same integrated circuit package includes forming protrusions on the surface of a first silicon wafer substrate by etching and forming complementary matching cavities, referred to herein as pits, on a second silicon wafer substrate by etching.

Figure 1:
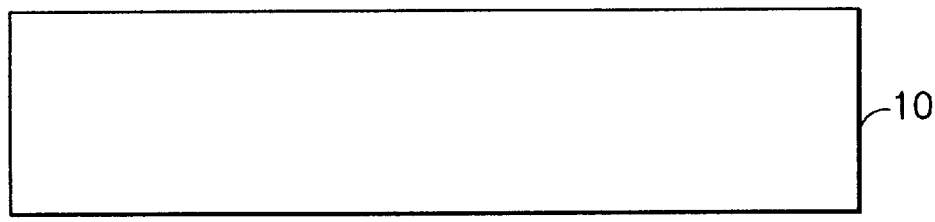
FIGS. 1, 2, 3 and 4 are schematic cross-section illustrations of various steps in the fabrication of structures having shaped contact points used for interconnecting multiple circuit chips according to the principle of the present invention.
Figure 2:
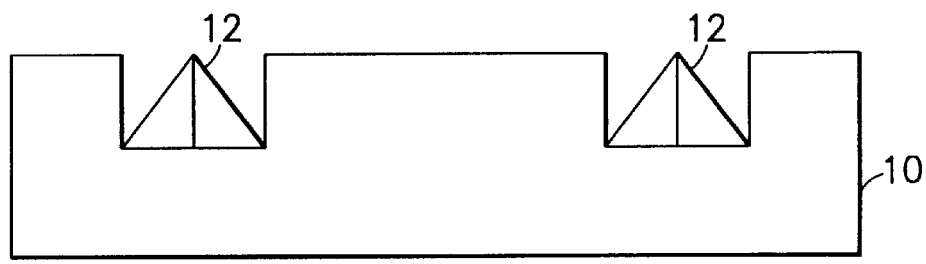

Referring to FIG. 1, a substrate 10, which may be a blank silicon [100] wafer is shown which is first etched through a first mask and then etched again through a second mask to form the pyramid structures 12 shown in FIG. 2, wherein the pyramid or tetragonal shaped areas 12 remaining in the etched away regions are protrusions to be used to form contact points.

Figure 3:
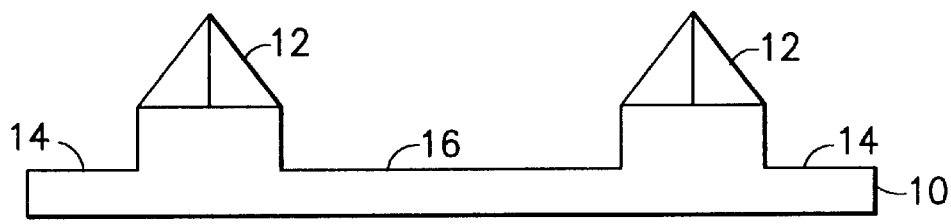
Figure 4:
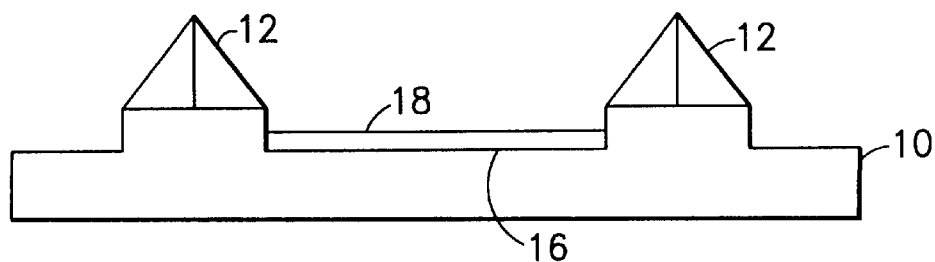

A photoresist mask is then formed over the tetragonal shaped areas 12, filling the recesses, and an isotropic etch, such as a reactive ion etch, is performed on wafer 10 for all the surface areas except the masked-off tetragonal shaped areas 12. The resist mask is then removed leaving the structure shown in FIG. 3. Areas 14 will be later used as pad areas and area 16 is the location where the active circuits will be formed. FIG. 4 shows the active circuits 18 formed on the wafer active area 16.

In the present embodiment of the invention the protrusions 12 formed on the surface of the first silicon wafer 10 are chosen to be tetrahedrally shaped. Two etch steps are required to form the four-sided contact point. A potassium hydroxide (KOH) enchant may be used to preferentially etch the silicon in the [111] planes faster than the [100] planes to form the contact points at angles of 54.7 degrees.

The preferential etching of silicon is discussed in the publication VLSI FABRICATION PRINCIPLES, S. K.

Gandhi, John Wiley and Sons, pg. 487 and the publication "An Integrated Air-Gap Capacitor Pressure Sensor and Digital Readout with Sub-100 Attofarad Resolution," IEEE Journal of Micromechanical Systems, Vol. 1, No. 3, pg. 121.

FIG. 5 illustrates the mask configuration for the first etch step and FIG. 6 shows the shape of the protrusion remaining within and below the surface of wafer 10 after the first etch. FIG. 7 shows the configuration of the mask for the second etch step and FIG. 8 shows the shape of the resultant tetragonal protrusion 12 after the second etch step. FIG. 9 is a top view of the resultant tetragonal protrusion 12.

A second circuit wafer 24 illustrated in FIG. 10 is etched to form recesses which are configured to have a shape that is the complement of the tetragonal protrusions 12. Only one square mask 20 having the same outer dimensions as the masks of FIGS. 5 and 7 is required for the etch step to form the four-sided recesses or pits 26 shown in the top view of FIG. 11. Only mask 20 and one preferential etch step are required to form the pits because the etchant naturally removes the sides of the pit 26 in sloped fashion to create a tetragonal shaped recess. The top view of the pit 26 shown in FIG. 12 looks the same as the top view of the protrusion shown in FIG. 9.

Referring again to FIG. 10, after pits 26 are created, active devices 28 are formed on the surface of wafer 24 as shown.

Figure 13:
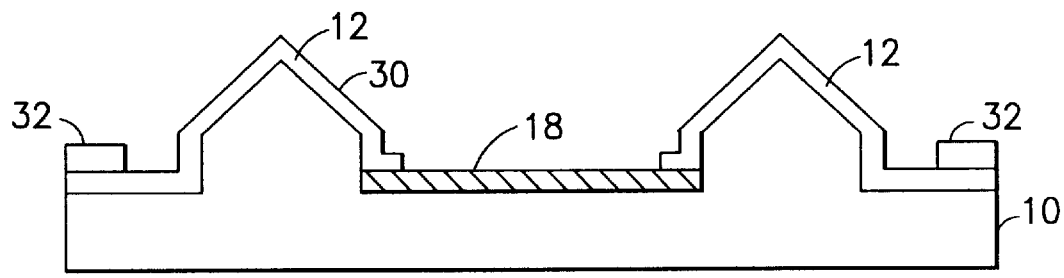
FIGS. 13 and 14 are cross sectional illustrations of circuit chips having metal formed on the point and pit contacts respectively.
Figure 14:
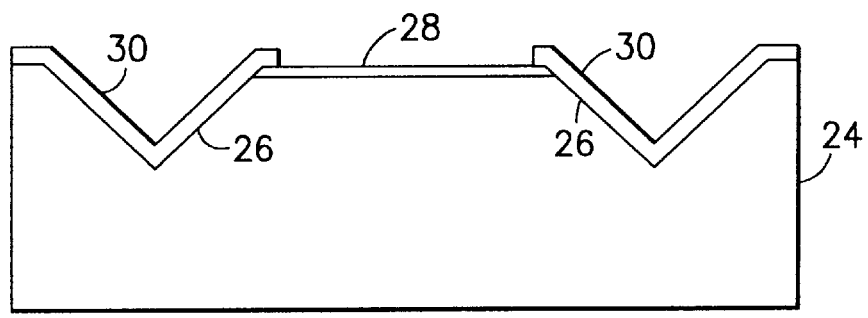

Next, as shown in FIGS. 13 and 14, the active devices 18 and 28 of the two circuit chips are masked and contact metal 30, such as aluminum is applied to cover the silicon pits 26 and protrusions 12 to form contacts. The metal external terminal contacts 32 for the circuit chips are also formed during this part of the process as shown in FIG. 13.

Figure 16:
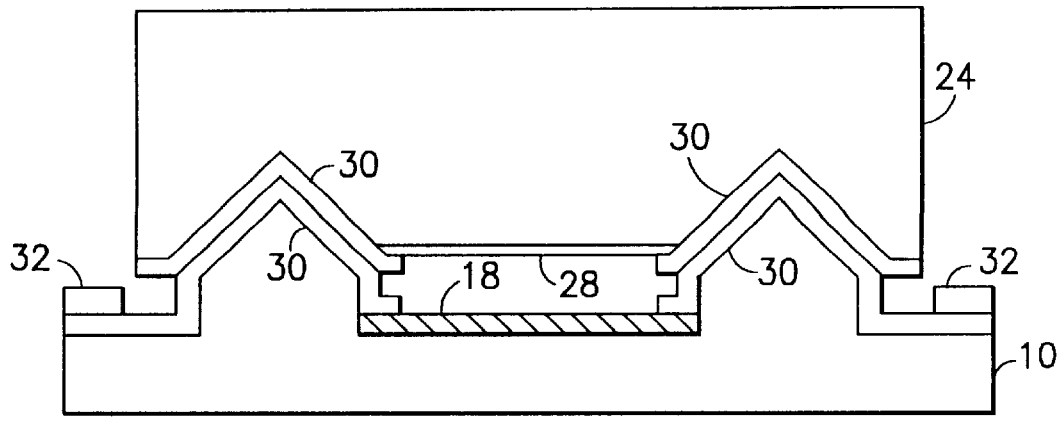
FIG. 16 is a schematic cross sectional illustration of a circuit chip with contact pits joined front to front on a circuit chip with contact points with metal reflow on the contacts.
Figure 15:
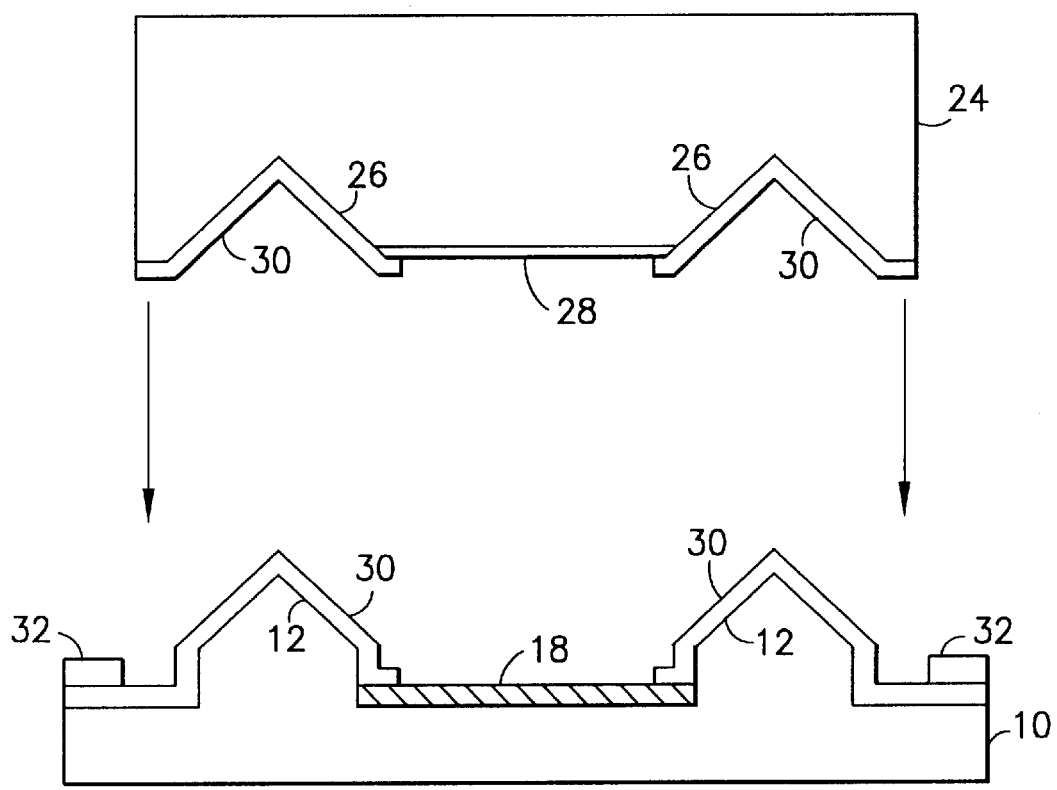
FIG. 15 is a cross sectional illustration of the manner in which the circuit chip having pit contacts is placed on the circuit chip with point contacts.

FIG. 15 shows the step wherein the circuit chip 24 with the metallized pit contacts 26 is aligned with the circuit chip 10 having the metallized point contacts 12. FIG. 16 illustrates the step wherein the two circuit chips 10 and 24 are joined and interlocked and point contacts 12 are mated with pit contacts 26. A low temperature anneal is then performed to reflow the metal 30 between the pits and the points. A feature of the present invention is that the pits and points can be arranged to key the proper selected orientation of the top and bottom chips 10 and 24.

In the multiple chip mounting structure of FIG. 16 the two circuit chips are mounted front to front. In the present invention the circuit chips can also be mounted back to front. This embodiment is shown in FIGS. 17 and 18.

Figure 17:
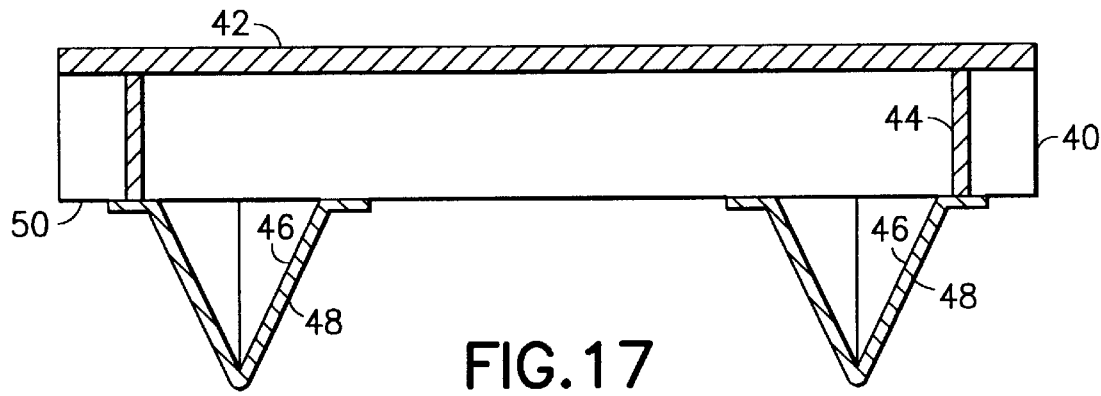
FIGS. 17 and 18 are schematic illustrations of the method of the present invention used to interconnect circuit chips back to front.

FIG. 17 shows a circuit chip 40 fabricated with the active circuit region 42 on the front and with vias 44 drilled through to the back 50 of chip 40. The back of chip 40 is etched as previously described to form pyramids 46 and then contact metal 48 is applied. In FIG. 18, cavities are preferentially etched into the front side 54 of circuit chip 56 to form pits 52 as previously described which are then metallized. Circuit chip 56 therefore has pits on its front side and protrusions on its back side.

Figure 18:
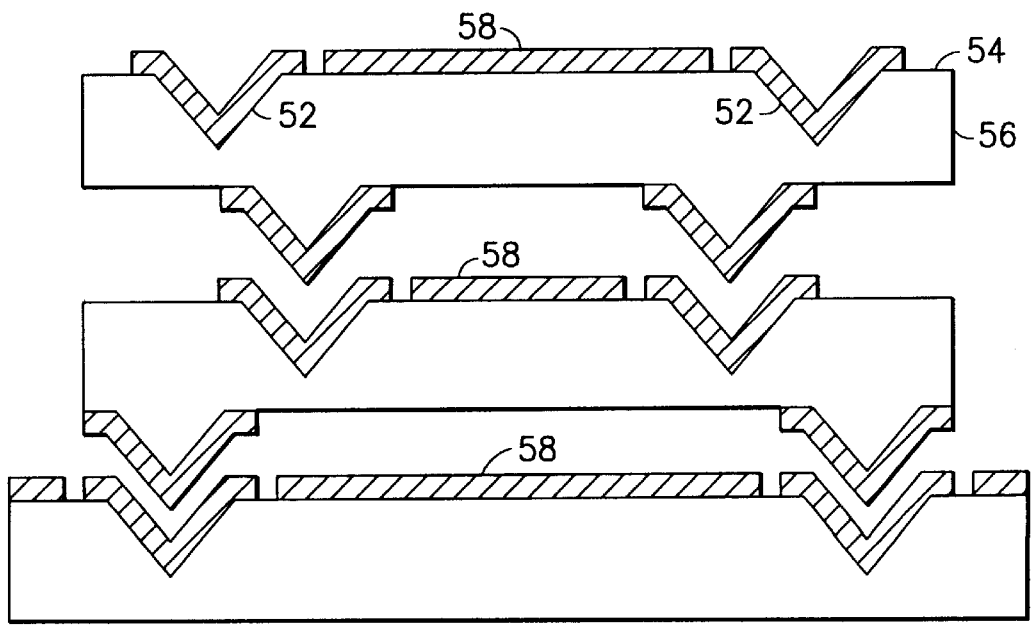

FIG. 18 also schematically illustrates a multichip stack of circuit chips mounted back to front with the active circuit regions 58 on the front. In this back to front embodiment tile points are etched deeper than the pits to provide a gap between the chips.

Although the points and pits described in the preceding embodiments are used to make electrical circuit connections, additional points and pits can be included in the stacked circuit chips solely for purposes of alignment, similar to a keyed connector. The pits used for alignment would need to be metallized or in some other way made to be the same height as the rest of the pits.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

What is claimed is:

1. A method for fabricating an interconnected multiple circuit chip structure comprising the steps of:

step 1, etching a first silicon substrate to form at least one protrusion on a surface of the first substrate;

step 2, preferentially etching the at least one protrusion to produce a selected shape for providing a first alignment structure element;

step 3, preferentially etching at least one cavity in the surface of a second substrate to form at least one alignment recess element having a selected shape that is the complement of the selected shape of the at least one protrusion;

step 4, coating the at least one protrusion and the at least one recess with an electrically conductive metal to provide first and second electrical and thermal connectors on the alignment structure elements;

step 5, joining and aligning the first substrate and the second substrate together wherein the at least one protrusion mates and aligns with the at least one recess and the metal coatings thereon come into contact to form an electrical circuit connection.

2. A method according to claim 1 wherein in step 1 the first silicon substrate is etched to form at least first and second protrusions separated by an active device region, and wherein the method includes the step of fabricating an integrated circuit on the active device region of the first substrate.

3. A method according to claim 2 wherein in step 3 the second silicon substrate is preferentially etched to form at least first and second cavities separated by an active device region, and wherein the method includes the step of fabricating an integrated circuit on the active region of the second substrate.

4. A method according to claim 3 wherein the protrusions and the integrated circuit on the first silicon substrate are on the same side of the substrate and the cavities and the integrated circuit on the second substrate are on the same side of the substrate.

5. A method according to claim 3 wherein the protrusions and the integrated circuit on the first silicon substrate are on opposite sides of the substrate.

6. A method according to claim 5 wherein the substrate further includes at least one via through the silicon substrate to provide electrical connection between the opposite sides of the substrate.

7. A method according to claim 3 wherein the method further includes the step of heating the joined first and second silicon substrates to anneal the contacting metal coatings to form conductive electrical connections between the circuit on the first substrate and the circuit on the second substrate.

8. A method according to claim 1 wherein the at least one protrusion is preferentially etched to form a tetragonal point and the at least one cavity is preferentially etched to form a tetragonal recess complementary to the pyramid.

* * * * *